US011569370B2

(12) United States Patent
Guler et al.

(10) Patent No.: US 11,569,370 B2
(45) Date of Patent: Jan. 31, 2023

(54) DEPOP USING CYCLIC SELECTIVE SPACER ETCH

(71) Applicant: Intel Corporation, Santa Clara, CA (US)

(72) Inventors: Leonard P. Guler, Hillsboro, OR (US); Vivek Thirtha, Portland, OR (US); Shu Zhou, Portland, OR (US); Nitesh Kumar, Beaverton, OR (US); Biswajeet Guha, Hillsboro, OR (US); William Hsu, Hillsboro, OR (US); Dax Crum, Beaverton, OR (US); Oleg Golonzka, Beaverton, OR (US); Tahir Ghani, Portland, OR (US); Christopher Kenyon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 703 days.

(21) Appl. No.: 16/454,408

(22) Filed: Jun. 27, 2019

(65) Prior Publication Data
US 2020/0411661 A1 Dec. 31, 2020

(51) Int. Cl.
H01L 29/66 (2006.01)
H01L 21/31 (2006.01)
H01L 29/06 (2006.01)
H01L 21/3105 (2006.01)

(52) U.S. Cl.
CPC .... H01L 29/6656 (2013.01); H01L 21/31053 (2013.01); H01L 29/0669 (2013.01); H01L 29/66484 (2013.01); H01L 29/66545 (2013.01); H01L 29/66575 (2013.01)

(58) Field of Classification Search
CPC .......... H01L 29/6656; H01L 21/31053; H01L 29/0669; H01L 29/66484; H01L 29/66545; H01L 29/66575; H01L 29/42392; H01L 29/78696; H01L 29/0673; H01L 29/66439
USPC ........................................... 257/365
See application file for complete search history.

(56) References Cited

U.S. PATENT DOCUMENTS 7,173,305 B2 * 2/2007 Yang ..................... H01L 29/785
257/E21.507
8,273,629 B2 * 9/2012 Wang ..................... H01L 21/84
438/257
8,530,971 B2 * 9/2013 Cheng ............... H01L 29/42364
257/365

(Continued)

Primary Examiner — Sheikh Maruf
(74) Attorney, Agent, or Firm — Schwabe, Williamson & Wyatt, P.C.

(57) ABSTRACT

An integrated circuit structure comprises a semiconductor fin protruding through a trench isolation region above a substrate. A gate structure is over the semiconductor fin. A plurality of vertically stacked nanowires is through the gate structure, wherein the plurality of vertically stacked nanowires includes a top nanowire adjacent to a top of the gate structure, and a bottom nanowire adjacent to a top of the semiconductor fin. A dielectric material covers only a portion of the plurality of vertically stacked nanowires outside the gate structure, such that one or more one of the plurality of vertically stacked nanowires starting with the top nanowire is exposed from the dielectric material. Source and drain regions are on opposite sides of the gate structure connected to the exposed ones of the plurality of vertically stacked nanowires.

18 Claims, 12 Drawing Sheets

(56) References Cited

U.S. PATENT DOCUMENTS

| | | | |
|---|---|---|---|
| 2006/0086985 A1* | 4/2006 | Kishida | H01L 21/823462 257/E21.654 |
| 2006/0289938 A1* | 12/2006 | Kim | H01L 27/105 257/365 |
| 2008/0277730 A1* | 11/2008 | Mehrotra | H01L 29/7833 257/365 |
| 2009/0179274 A1* | 7/2009 | Jung | H01L 29/6656 257/E29.264 |
| 2011/0266625 A1* | 11/2011 | Carter | H01L 21/823807 257/E29.264 |
| 2012/0025315 A1* | 2/2012 | Kronholz | H01L 29/165 257/E29.264 |
| 2013/0161756 A1* | 6/2013 | Glass | H01L 29/775 257/E21.632 |
| 2014/0175553 A1* | 6/2014 | Miyata | H01L 29/7831 257/365 |
| 2015/0236120 A1* | 8/2015 | Hashemi | H01L 29/66439 438/284 |
| 2016/0099344 A1* | 4/2016 | Liu | H01L 21/31116 438/284 |

\* cited by examiner

1x Cycle

2x Cycle

3x Cycle

1x Cycle

2x Cycle

3x Cycle

4x Cycle

DEPOP USING CYCLIC SELECTIVE SPACER ETCH

TECHNICAL FIELD

Embodiments of the disclosure are in the field of integrated circuit structures and, in particular, methods of fabricating a nanowire-based integrated circuit structure fabricated with a dry-etch-poly-open-polish (DEPOP) using a cyclic selective spacer etch.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. Variability in conventional and state-of-the-art fabrication processes may limit the possibility to further extend them into the sub-10 nm range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
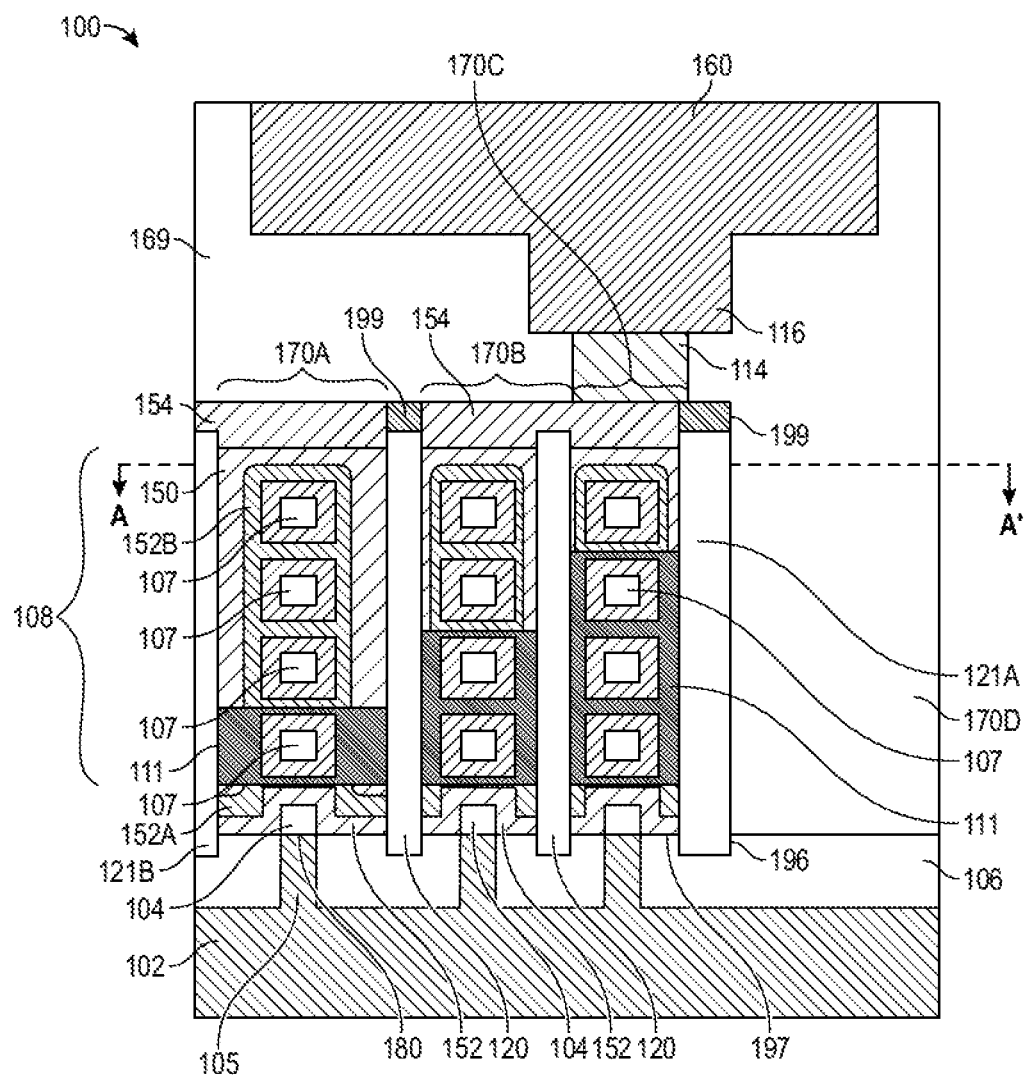
FIG. 1A illustrates a cross-sectional view of a nanowire-based integrated circuit structure fabricated with a dry-etch-poly-open-polish (DEPOP) using a cyclic selective spacer etch, in accordance with an embodiment of the present disclosure.

Fabrication of integrated circuit structures with a dry-etch-poly-open-polish (DEPOP) using cyclic selective spacer etch is described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to structures and architectures for fabricating integrated circuit structures with a dry-etch-poly-open-polish (DEPOP) process using cyclic selective spacer etch. Embodiments may include or pertain to one or more of non-planar transistors, nanowire/nanoribbon-based transistors, and system-on-chip (SoC) technologies. One or more embodiments may be implemented to realize customizable high performance non-planar transistors in SoCs of future technology nodes.

To provide context, there is increased need for advanced SoCs to include both logic and I/O ICs and to control the amount of drive each individual transistors has. Typically, it is not possible to easily control the drive of individual nonplanar transistors.

In accordance with one or more embodiments described herein, nonplanar transistors comprising multiple nanowires/nanoribbons are fabricated by fabricating integrated circuit structures with a dry-etch-poly-open-polish (DEPOP) process using a cyclic selective spacer etch to expose only the nanowires/nanoribbons desired to be connected. During gate processing, all the nanowires/nanoribbons are released regardless of how many of the nanowires/nanoribbons are to be connected by the source/drain region. According to the disclosed embodiments, by controlling the number of nanowires/nanoribbons that are connected in each transistor, the amount of drive each transistor has can be tailored as desired. In addition, transistors fabricated using such an architecture may exhibit an increase in stability and performance. Applications of such systems may include, but are not limited to, logic, I/O or analog applications. Embodiments described herein may include unique architectures comprising a plurality of non-planar nanowire/nanoribbon structures (e.g., vertical nanowire FETs (v-NWFETs)) that have varying numbers of exposed and connected nanowires/nanoribbons.

Figure 1B:
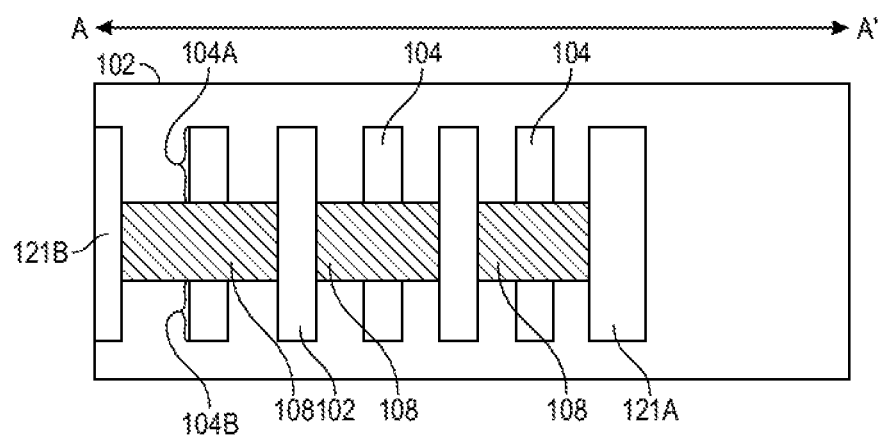
FIG. 1B illustrates a plan view taken along the a-a' axis of the integrated circuit structure of FIG. 1A.

FIG. 1A illustrates a cross-sectional view of a nanowire-based integrated circuit structure fabricated with a dry-etch-poly-open-polish (DEPOP) using a cyclic selective spacer etch, in accordance with an embodiment of the present disclosure. FIG. 1B illustrates a plan view taken along the a-a' axis of the integrated circuit structure of FIG. 1A.

Referring to FIG. 1A, a semiconductor structure 100 includes a plurality of nonplanar active regions 170A, 170B, 170C, 170D (collectively referred to as nonplanar active regions 170) above a substrate 102. In one embodiment, each of the nonplanar active regions 170 comprises a semiconductor fin protruding through a trench isolation region above a substrate, and a gate structure over the semiconductor fin. Thus, the fins may have a protruding fin portion 104 and a sub-fin region 105 formed from substrate 102 within a trench isolation layer 106. In an embodiment, the fin structures are a plurality of fin lines that form a grating structure such as a tight pitch grating structure. In one such embodiment, the tight pitch is not achieved directly through conventional lithography, but the pitch may be halved by the use of spacer mask patterning, pitch halving, pitch quartering, or other pitch division, approach. Each of the individual fins depicted may represent corresponding individual fins, or may represent a plurality of fins at a given location.

A plurality of vertically stacked nanowires 107 overlying the semiconductor fin are formed through a gate structure 108 (in/out of the page). In one embodiment, the plurality of vertically stacked nanowires 107 includes a top nanowire adjacent to a top of the gate structure 108, and a bottom nanowire adjacent to a top of the protruding fin portion 104. Accordingly, the nonplanar active regions include two or more nanowires. In the specific example of FIG. 1A, the nonplanar active regions are shown with four nanowires.

In one embodiment, the semiconductor fin and corresponding vertically stacked nanowires 107 may be referred to as a semiconductor fin/nanowire pair. Although the term "nanowire" may be used, the term is intended to refer to both wire and ribbon structures that may have square or rounder corners. It is also to be appreciated that reference to or depiction of a fin/nanowire pair throughout may refer to a structure including a fin and one or more overlying nanowires. The nanowires may be sized as wires or ribbons, as described below, and may have squared-off or rounder corners. In one embodiment however, the nanowires have a wide and flat cross-section shape. In an embodiment, the nanowires comprise a material such as, but not limited to, silicon, germanium, or both silicon and germainium. In one such embodiment, the nanowires are single-crystalline. For example, for a silicon nanowire, a single-crystalline nanowire may be based from a (100) global orientation, e.g., with a<100> plane in the z-direction. As described below, other orientations may also be considered. In an embodiment, the nanowires are composed of a strained material, particularly in the channel regions.

In an embodiment, the dimensions of the nanowires, from a cross-sectional perspective, are on the nanoscale. For example, in a specific embodiment, the smallest dimension of the nanowires is less than approximately 20 nm, or may range from 8-10 nm in width in a specific embodiment. In one embodiment, the nanowires may range from 8-30 nm in length through the gate.

Gate structures 108 are over the protruding portions 104 of the nonplanar active regions 170 and around the overlying vertically stacked nanowires 107, such that the vertically stacked nanowires 107 are through the corresponding gate structures 108. The gate structures 108 are also over a portion of the trench isolation layer 106. As shown, gate structures 108 include a gate electrode 150 and a gate dielectric layer 152. In one embodiment, although not shown, gate structures 108 may also include a dielectric cap layer. Gate structures 108 may be separated by isolation regions, such as narrow self-aligned gate endcap (SAGE) isolation structures or walls 120, 121A and 121B of the same or different widths. Each SAGE wall 120, 121A and 121B may include one or more of a local interconnect 154 or a dielectric plug 199 formed thereon. In an embodiment, each of the SAGE walls 120, 121A or 121B is recessed below an uppermost surface 197 of the trench isolation layer 106.

According to the disclosed embodiments, a dielectric material 111 may cover only a portion of the plurality of vertically stacked nanowires 107 outside the gate structure 108 in the nonplanar active regions 170, such that one or more of the plurality of vertically stacked nanowires 107 starting with the top nanowire is exposed from the dielectric material 111. Source and drain regions 104A and 104B (shown in FIG. 1B) are over the dielectric material 111 on opposite sides of the gate structures 108 and are connected only to the exposed ones of the plurality of vertically stacked nanowires 107 in the nonplanar active regions 170. Accordingly, at least some of the nonplanar active regions 170 have varying numbers of exposed nanowires connected to the respective source and drain regions 104A and 104B to control the amount of drive current for the corresponding nonplanar active region 170, where the higher the number of exposed nanowires results in a higher amount of drive current.

For example, nonplanar active region 170A may include a first plurality of semiconductor fin/nanowire pairs (fin/nanowire pair(s) 104/107) above the substrate 102 and protruding through an uppermost surface 197 of the trench isolation layer 106, a first gate structure (gate structure 108 of nonplanar active region 170A) over the first plurality of semiconductor fin/nanowire pairs, and three of the plurality nanowires exposed from the dielectric material 111 and connected to the source and drain regions 104A and 104B. Nonplanar active region 170B includes a second plurality of semiconductor fin/nanowire pairs (fin/nanowire pair(s) 104/107) above the substrate 102 and protruding through the uppermost surface 197 of the trench isolation layer 106, a second gate structure (gate structure 108) over the second plurality of semiconductor fin/nanowire pairs, and two nanowires exposed from the dielectric material 111 and connected to the source and drain regions 104A and 104B. Nonplanar active region 170C is similar to nonplanar active region 170B, but is shown with only the single top nanowire exposed from the dielectric material 111 and connected to the source and drain regions 104A and 104B.

In an embodiment, active region 170A may be an I/O region, and active region 170B may be logic region. As depicted, in one such embodiment, a second logic region 170C is adjacent the logic region 170B, and is electrically connected to the logic region 170B by a local interconnect 154. Another region 170D may be a location where an addition logic or I/O region may be placed. An isolation structure, such as SAGE wall 120, may be between and in contact with adjacent gate structures 108.

A gate contact 114, and overlying gate contact via 116 are also seen from the perspective of FIG. 1A, along with an overlying metal interconnect 160, all of which are in interlayer dielectric stacks or layers 169. Also shown is that in one embodiment the gate contact 114 is over the non-planar active regions 170. As is also depicted in FIG. 1A, an interface 180 exists between a doping profile of protruding fin portions 104 and sub-fin regions 105, although other embodiments do not include such an interface in doping profile between these regions.

Referring to FIGS. 1A and 1B, the gate structures 108 are shown as over the protruding fin portions 104 and corresponding vertically stacked nanowires 107, as isolated by gate isolation structures 120. In an embodiment, the gate structures 108 form one line of a plurality of parallel gate lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like gate patterns may have lines spaced at a constant pitch and having a constant width. The pattern may be fabricated by a pitch halving or pitch quartering, or other pitch division, approach.

Referring again to FIG. 1B, source and drain regions 104A and 104B of the protruding fin portions 104 and corresponding nanowire(s) are shown, although it is to be appreciated that these regions would be overlapped with trench contact structures. In one embodiment, the source and drain regions 104A and 104B are doped portions of original material of the protruding fin/nanowire portions 104/107. In another embodiment, the material of the protruding fin/nanowire portions 104/107 is removed and replaced with another semiconductor material, e.g., by epitaxial deposition. In either case, the source and drain regions 104A and 104B may extend below the height of trench isolation layer 106, i.e., into the sub-fin region 105.

In an embodiment, the semiconductor structure 100 includes non-planar devices such as, but not limited to, a finFET or a tri-gate device with corresponding one or more overlying nanowire structures. In such an embodiment, a corresponding semiconducting channel region is composed of or is formed in a three-dimensional body with one or more discrete nanowire channel portions overlying the three-dimensional body. In one such embodiment, the gate structures 108 surround at least a top surface and a pair of sidewalls of the three-dimensional body, and further surrounds each of the one or more discrete nanowire channel portions.

Substrate 102 may comprise a semiconductor material that can withstand a manufacturing process and in which charge can migrate. In an embodiment, substrate 102 is a bulk substrate composed of a crystalline silicon, silicon/germanium or germanium layer doped with a charge carrier, such as but not limited to phosphorus, arsenic, boron or a combination thereof, to form active region 104. In one embodiment, the concentration of silicon atoms in bulk substrate 102 is greater than 97%. In another embodiment, bulk substrate 102 is composed of an epitaxial layer grown atop a distinct crystalline substrate, e.g. a silicon epitaxial layer grown atop a boron-doped bulk silicon mono-crystalline substrate. Bulk substrate 102 may alternatively be composed of a group III-V material. In an embodiment, bulk substrate 102 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 102 is composed of a III-V material and the charge-carrier dopant impurity atoms are ones such as, but not limited to, carbon, silicon, germanium, oxygen, sulfur, selenium or tellurium.

Trench isolation layer 106 may comprise a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the trench isolation layer 106 is composed of a dielectric material such as, but not limited to, silicon dioxide, silicon oxy-nitride, silicon nitride, or carbon-doped silicon nitride.

Self-aligned gate endcap isolation structures 120, 121A and 121B may comprise a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

Gate structures 108 may comprise a gate electrode stack, which includes a gate dielectric layer 152 and a gate electrode layer 150. In an embodiment, the gate electrode of the gate electrode stack is composed of a metal gate and the gate dielectric layer includes a high-k material. In an exemplary embodiment, the gate structure 108 may include a gate dielectric 152 conformal with the first plurality of semiconductor fin/nanowire pairs and laterally adjacent to and in contact with a first side of the gate endcap isolation structure (left-hand 120). In one embodiment, the gate dielectric may comprise two or more dielectric layers (e.g., layers 152A and 152B). In another embodiment, the gate dielectric 152 comprises a single layer 152A. In an embodiment, the gate dielectric of region 170A is an I/O gate dielectric, and the gate dielectric of region 170B is a logic gate dielectric.

In an embodiment, the gate dielectric of region 170B may comprise a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 102. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In an embodiment, the top high-k portion consists of a "U"-shaped structure that includes a bottom portion substantially parallel to the surface of the substrate and two sidewall portions that are substantially perpendicular to the top surface of the substrate. In an embodiment, the gate dielectric of region 170A may include a layer of non-native silicon oxide in addition to a layer of high-k material. The layer of non-native silicon oxide may be formed using a CVD process and may be formed below or above the layer of high-k material. In an exemplary embodiment, the layer of non-native silicon oxide (e.g., layer 152A) is formed below a layer of high-k material (e.g., layer 152B).

In one embodiment, the gate electrode comprises a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode comprises a non-workfunction-setting fill material formed above a metal workfunction-setting layer. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Local interconnect 154, gate contact 114, overlying gate contact via 116, and overlying metal interconnect 160 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). A common example is the use of copper structures that may or may not include barrier layers (such as Ta or TaN layers) between the copper and surrounding ILD material. As used herein, the term metal includes alloys, stacks, and other combinations of multiple metals. For example, the metal interconnect lines may include barrier layers, stacks of different metals or alloys, etc.

In general, the process for fabricating the nanowire-based integrated circuit structure may comprise forming a semiconductor fin protruding through a trench isolation region above a substrate. A plurality of vertically stacked nanowires and a sacrificial gate structure is formed around the semiconductor fin, wherein the plurality of vertically stacked nanowires are formed through the sacrificial gate structure and includes a top nanowire adjacent to a top of the sacrificial gate structure, and a bottom nanowire adjacent to a top of the semiconductor fin. A spacer comprising a dielectric material is formed over the plurality of vertically stacked nanowires and the sacrificial gate structure. The spacer is removed from one or more of the vertically stacked nanowires on opposite sides of the gate using a cyclic selective spacer etch starting with the top nanowire. Source and drain regions are formed on the opposite sides of the sacrificial gate structure to connect only to the exposed ones of the plurality of vertically stacked nanowires.

Embodiments of the cyclic selective spacer etch are described below with respect to FIGS. 2A-2F, 3A-E and 4A-4H.

Figure 2A:
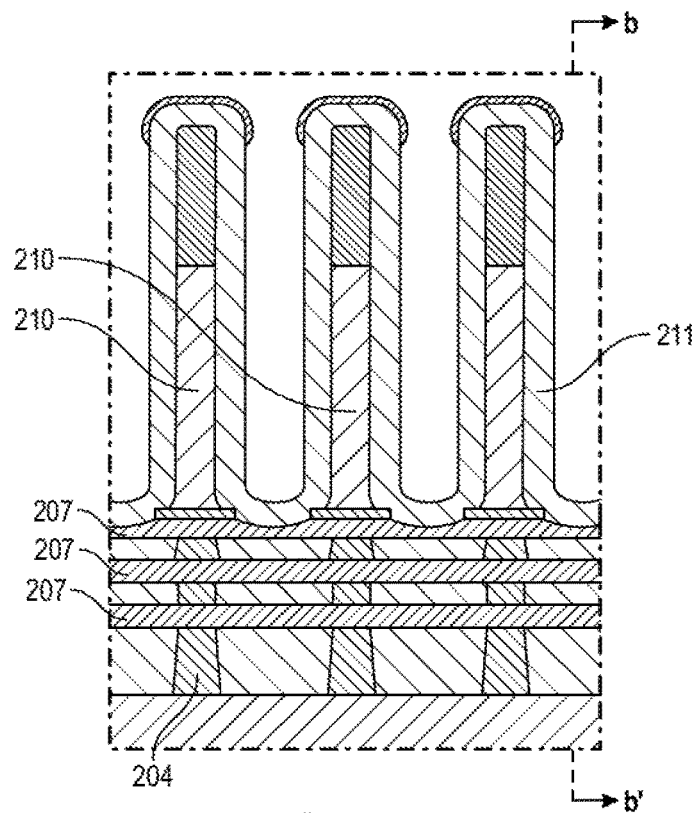
FIG. 2A illustrates a fin cross-sectional view of a nanowire-based integrated circuit structure perpendicular to dummy gate structures.
Figure 2B:
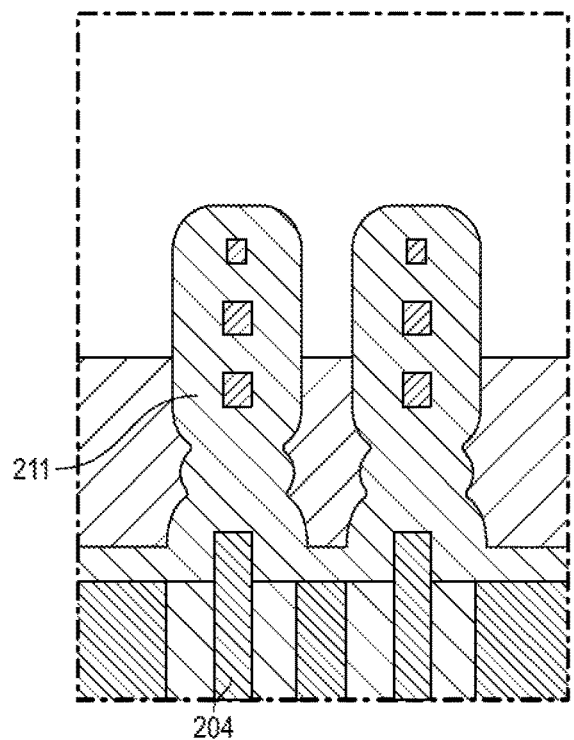
FIGS. 2B-2F illustrate a source/drain cross-sectional view of the nanowire-based integrated circuit structure taken along the b-b' axis of circuit structure of FIG. 2A.

FIG. 2A illustrates a fin cross-sectional view of a nanowire-based integrated circuit structure perpendicular to dummy gate structures. FIGS. 2C-2F illustrate source/drain cross-sectional view of the nanowire-based integrated circuit structure taken along the b-b' axis of circuit structure of FIG. 2A. Referring to FIGS. 2A and 2B, dummy gate structures 210 are shown formed over the fins 204 and a plurality of nanowires 207. The dummy gate structures 210 and the nanowires 207 are surrounded by a spacer material 211 (e.g., a dielectric).

Referring to FIGS. 2C-2F, processing of the nanowire-based integrated circuit structure is shown to sequentially expose a desired number the nanowires via a dry-etch-poly-open-polish (DEPOP) process with a cyclic selective spacer etch of the disclosed embodiments. The number of selective spacer etch cycles performed equals the number of nanowires to be exposed. In this particular example, the nanowire-based integrated circuit structure comprises a stack of three silicon nanowires 207 and in this case, a selective spacer etch is cycled three times (3×) to sequentially expose all three nanowires 207.

Figure 2C:
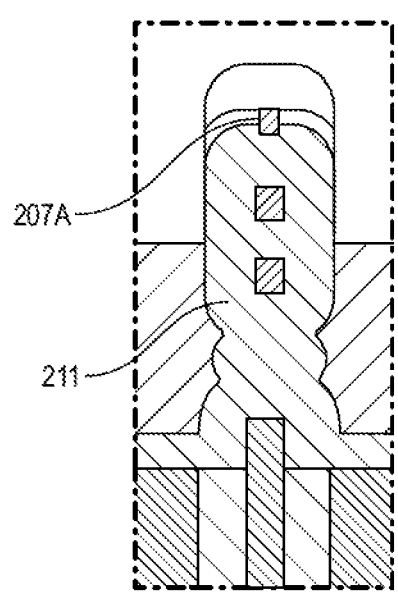
Figure 2D:
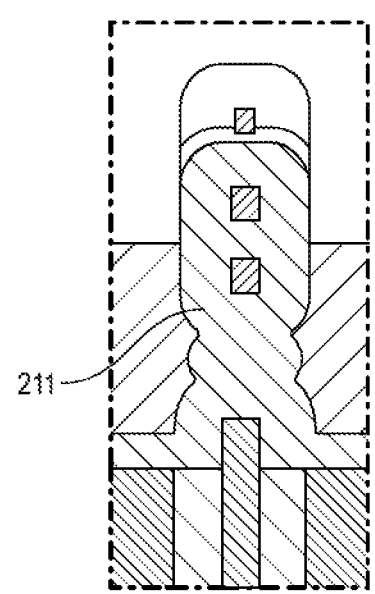

FIGS. 2C and 2D show a first cycle of the selective spacer etch that removes the top of the space material 211 and cuts the top nanowire 207A. According to one aspect of the disclosed embodiments, each cycle of the selective spacer etch comprises two separate etches. FIG. 2C shows that the first etch in a cycle is to etch the spacer material 211 selective to one of the nanowires (e.g., the top silicon nanowire 207A in this example). FIG. 2D shows that the second etch in a cycle is to cut the nanowire 207A by selectively etching the silicon selective to the spacer material 211.

Figure 2E:
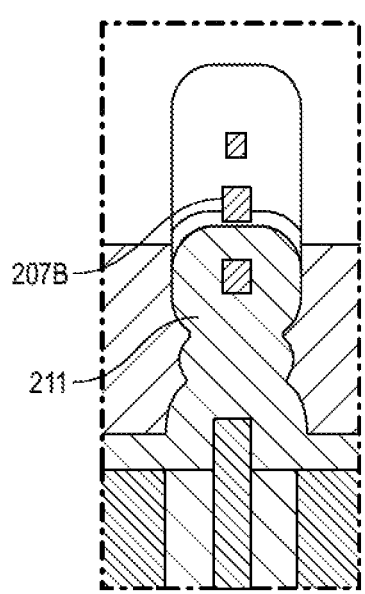
Figure 2F:
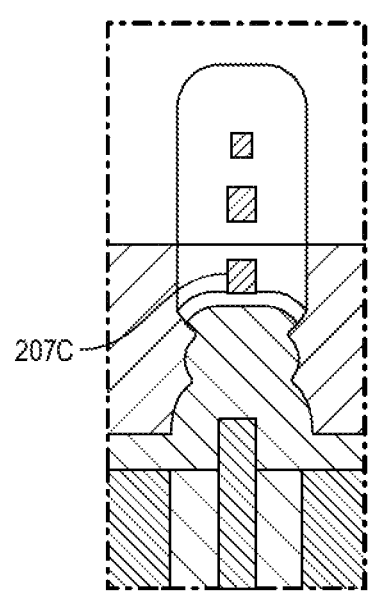

FIG. 2E shows the second cycle of the selective spacer etch removes the spacer material 211 over the middle nanowire 207B and then cuts the middle nanowire 207B. FIG. 2F shows the third cycle of the selective spacer etch that removes the spacer material 211 over the bottom nanowire 207C and then cuts the bottom nanowire 207C. After the cyclic selective spacer etch, source and drain regions are epitaxially grown along the sides of the gates where the silicon nanowires are exposed, which connects the exposed nanowires to the source/drains.

Figure 3A:
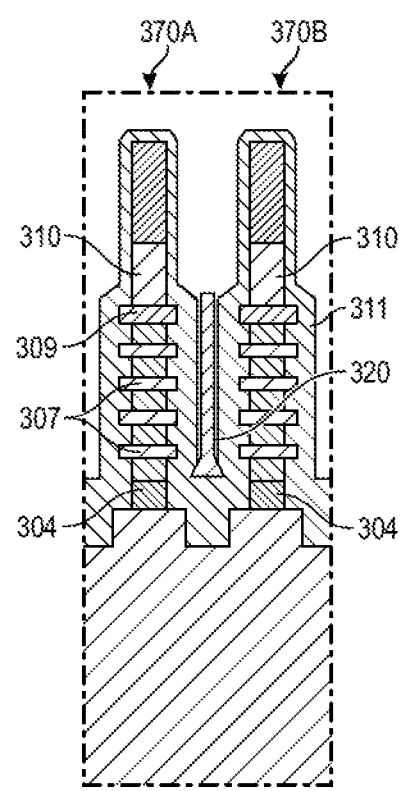
FIGS. 3A-3E illustrate a fin cross-sectional views of a four nanowire-based integrated circuit structure and progression of the cyclic selective spacer etch of the disclosed embodiments.

As a further example, FIGS. 3A-3E illustrate fin cross-sectional views of a four nanowire-based integrated circuit structure and progression of the cyclic selective spacer etch of the disclosed embodiments. FIG. 3A shows two adjacent nonplanar active regions 370A and 370B of the nanowire-based integrated circuit structure. The nonplanar active regions 370A and 370B comprise a dummy gate structure 310 over a semiconductor fin 304 and a stack of four nanowires 307 therebetween. In one embodiment, a hardmask 309 may be present over the top silicon nanowire 307. Both nonplanar active regions 370A and 370B are covered by a spacer material 311 and an isolation structure 320 is shown separating the two dummy gate/nanowire stacks. The nanowires extending between the nonplanar active regions 370A and 370B have already been cut and separated in this example.

FIG. 3B-3E show that in this example, a 4× cycle selective spacer etch is used to sequentially expose all four nanowires 207 in each stack. In other embodiments, the selective spacer could be performed in less cycles and a different number of cycles may be performed on different nanowire stacks of the IC.

Figure 3B:
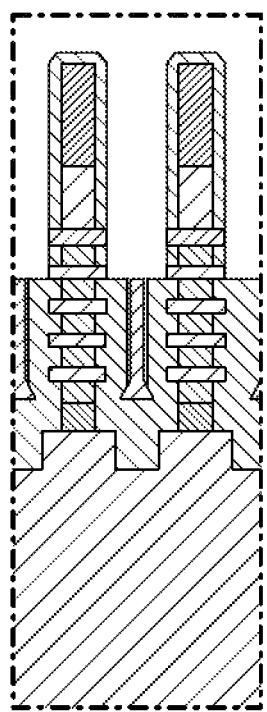
Figure 3C:
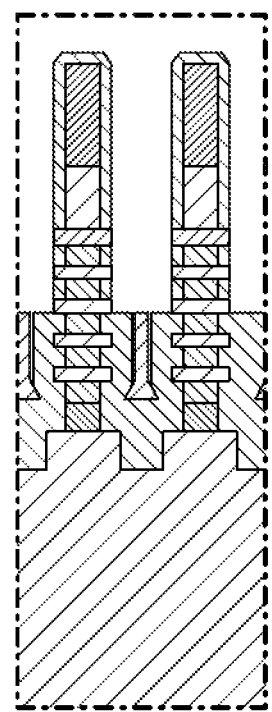
Figure 3D:
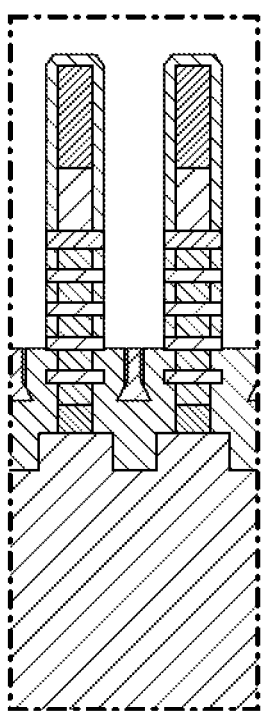
Figure 3E:
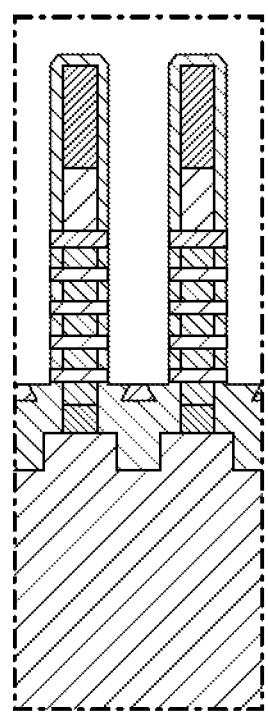

FIG. 3B shows the first cycle of the selective spacer etch removes the spacer material 311 (and the isolation structure 320) from the first or top nanowire in the nonplanar active regions 370A and 370B. FIG. 3C shows the second cycle of the selective spacer etch removes the spacer material 311 from the second nanowire in the nonplanar active regions 370A and 370B. FIG. 3D shows the third cycle of the selective spacer etch removes the spacer material 311 from the third nanowire in the nonplanar active regions 370A and 370B. FIG. 3E shows the fourth cycle of the selective spacer etch removes the spacer material 311 from the fourth or bottom nanowire in the nonplanar active regions 370A and 370B.

FIGS. 4A-4H illustrate angled three-dimensional cross-sectional views representing various operations in a method of fabricating a nanowire portion of a fin/nanowire structure in accordance with one embodiment. Part (a) of the figures is a fin cross-section view, while part (b) is a source/drain cross-section view.

Figure 4A:
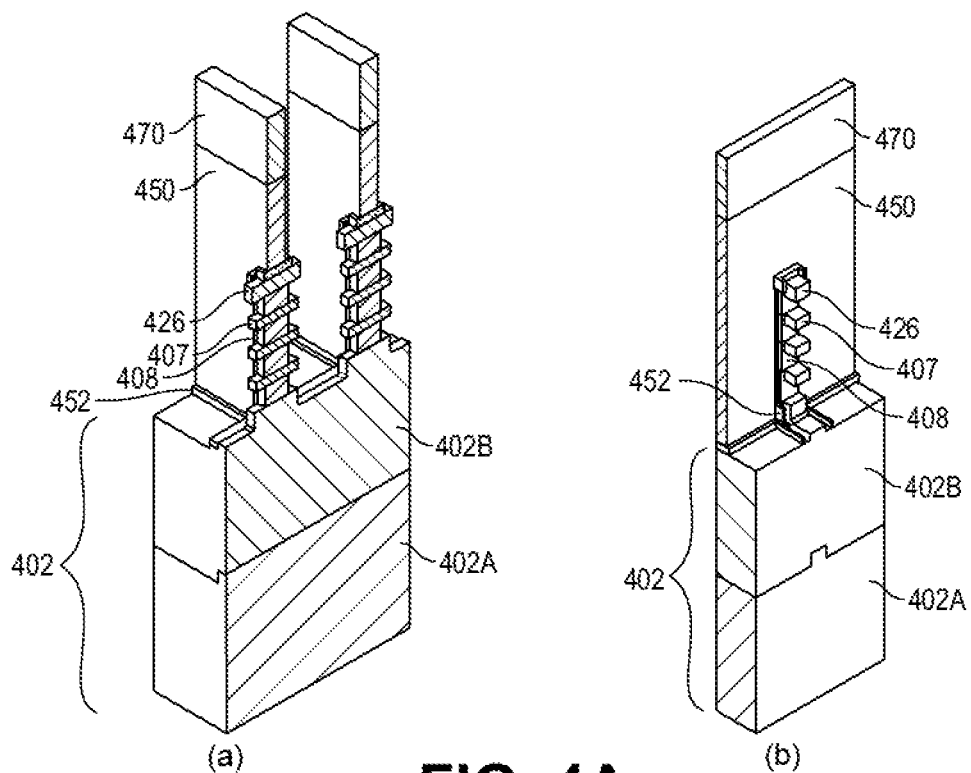
FIGS. 4A-4H illustrate angled three-dimensional cross-sectional views representing various operations in a method of fabricating a nanowire portion of a fin/nanowire structure in accordance with one embodiment.

FIG. 4A illustrates that the fabrication process begins with a vertical stack of nanowires formed over a fin and a dummy gate formed over the nanowires and the fin. More specifically, a substrate 402 (e.g., comprising an insulating silicon dioxide layer 402B over a bulk substrate silicon substrate 402A) has an alternating stack of silicon layers 407/silicon germanium layers 408 thereon over the fin to form three silicon nanowires. A nitride hardmask 426 may be present over silicon layer 407/silicon germanium layer 408 stack, which may be removed in the final device in some embodiments. A sacrificial polysilicon gate 450 is formed around the silicon layers 407/silicon germanium layers 408 with a gate oxide material 452 in-between. In embodiments, the sacrificial polysilicon gate 450 and the gate oxide 452 will eventually be replaced. A gate spacer 470 may protect the top of the sacrificial polysilicon gate 450. In embodiments, the silicon germanium layer 408 may be recessed relative to the silicon layers 407 to be approximately gate width. It is to be understood that, in another embodiment, a silicon germanium layer/silicon layer stack may be used to form four silicon germanium nanowires.

It is to be appreciated that in subsequent fabrication process steps, the sacrificial polysilicon gate 450 and the silicon germanium layer 408 may be replaced by gate metal during a replacement gate process. The gate oxide 452 may be replaced by another dielectric, such as high-k or hafnium oxide, although other dielectrics could also be used.

Figure 4B:
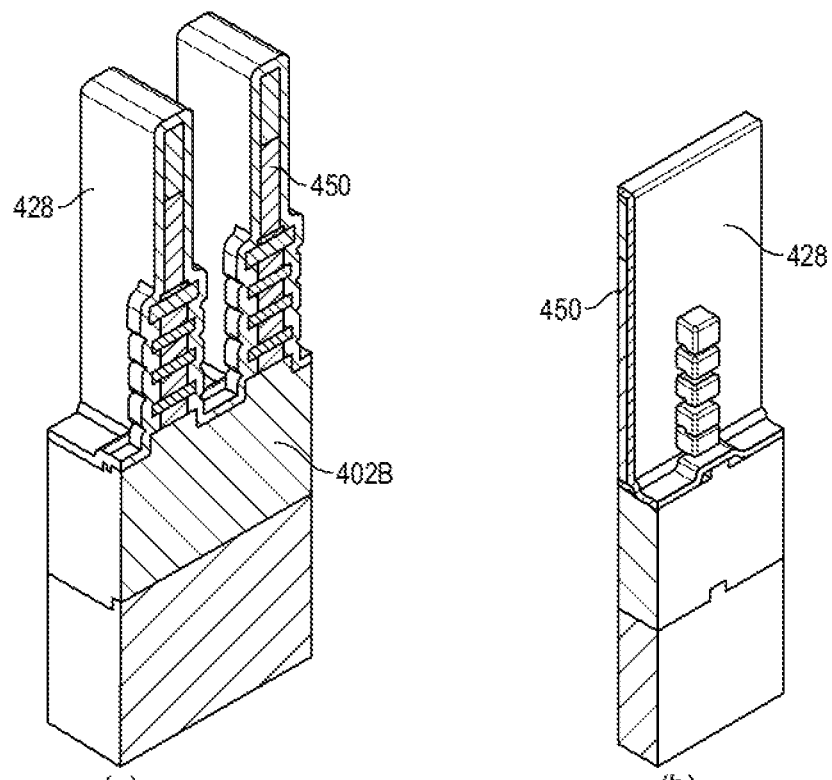
Figure 4C:
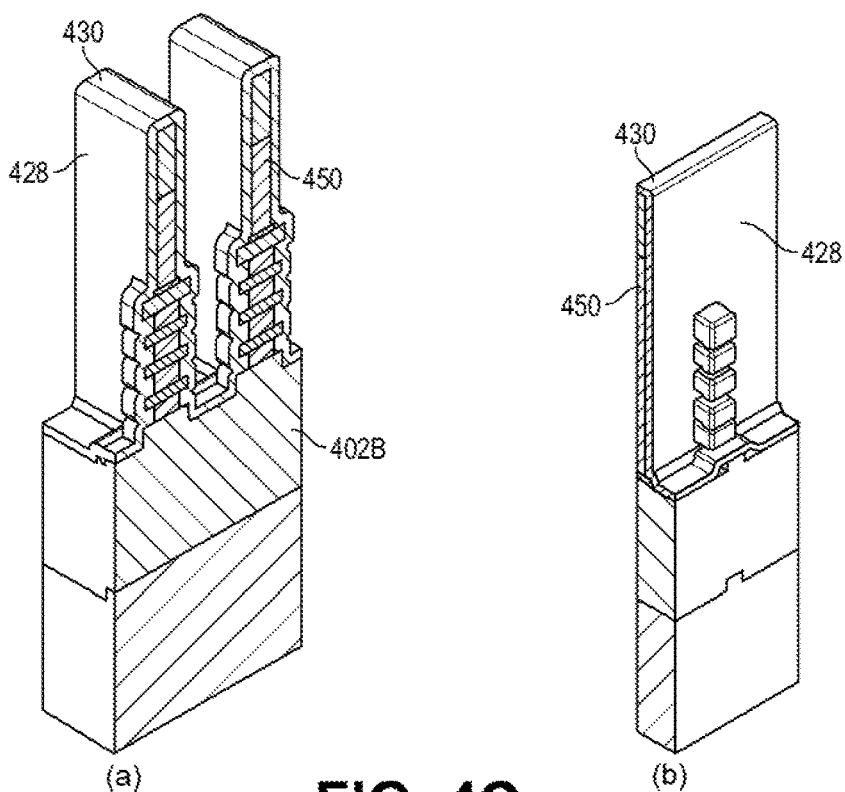
Figure 4D:
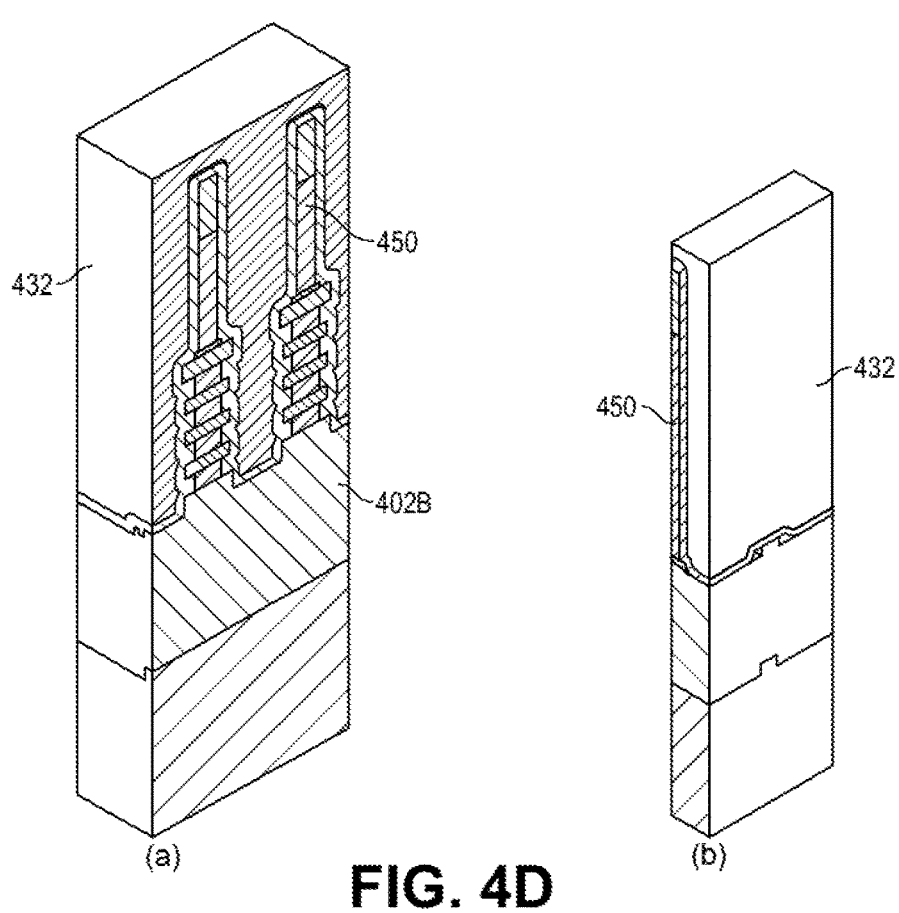

FIG. 4B illustrates that following patterning to form the sacrificial gate 450 a dimple spacer 428 may be formed/deposited on the sidewalls of the sacrificial gate 450 and a top surface of the silicon dioxide layer 402B. FIG. 4C illustrates the process after a helmet hardmask 430 is formed on the top surface of the dimple spacer 428 to protect the dimple spacer 428 from the subsequent spacer etch. In one embodiment, the helmet hardmask 430 may comprise titanium nitride. FIG. 4D illustrates the process after a carbon hardmask (CHM) 432 or spacer is formed (e.g., blanket deposited) over the sacrificial gate 450 and the silicon dioxide layer 402B.

Figure 4E:
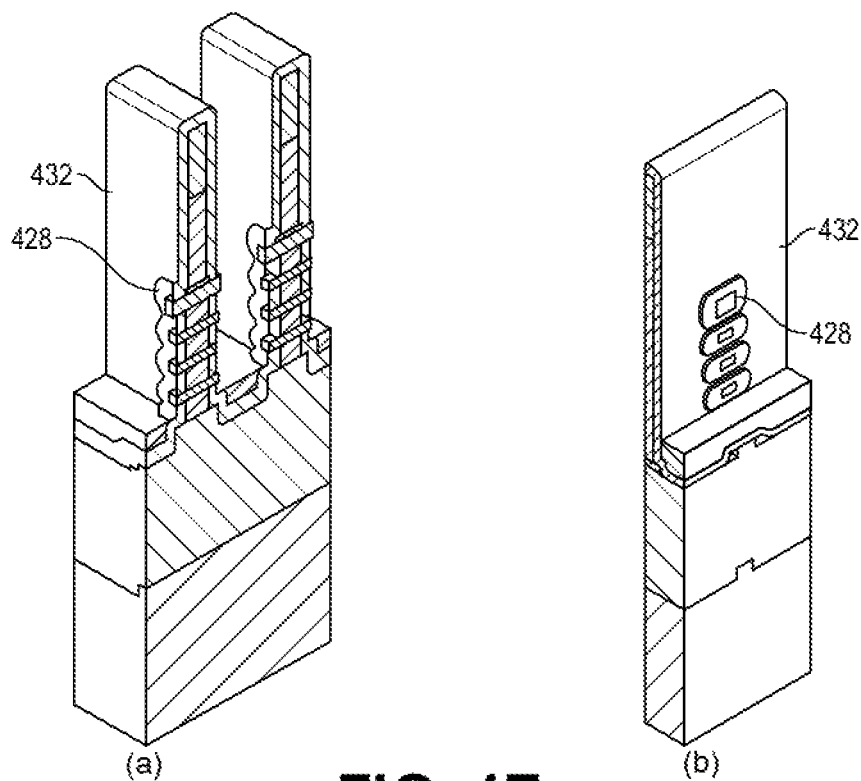

FIG. 4E illustrates the process after the CHM 432 and the dimple spacer 428 are etched down to a desired height to expose ends of the silicon nanowires. In the example shown, the CHM 432 has been etched to expose all three silicon nanowires. In other examples, the CHM 432 could be etched down to expose only the first/top silicon nanowire, or to expose the first two silicon nanowires. There are multiple embodiments for exposing the silicon nanowires. For example, in one embodiment, the CHM 432 may be etched using an etch that is very selective to the CHM 432, and then the CHM 432 is recessed to a desired level by the cyclic selective etch as shown in FIGS. 2A-2F and 3A-3E. In another embodiment, the CHM 432 may be etched using an etch that is not selective to the CHM 432, such that the CHM 432, the dimple spacer 428 and the silicon nanowires are etched at the same time.

Figure 4F:
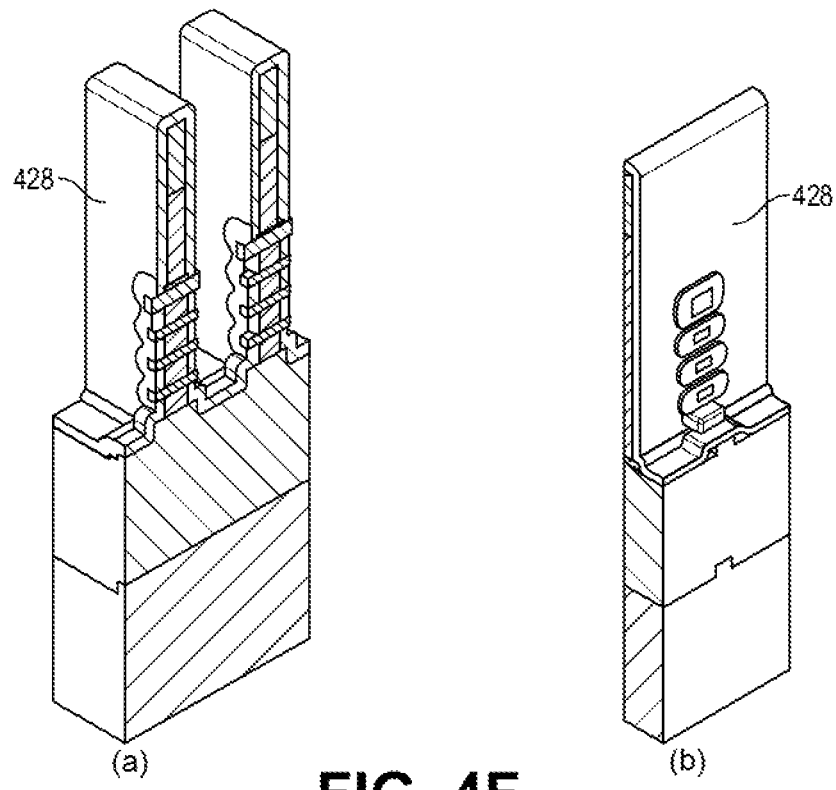

FIG. 4F illustrates the process after a plasma action is performed to remove the remaining CHM 432 down to the dimple spacer 428.

Figure 4G:
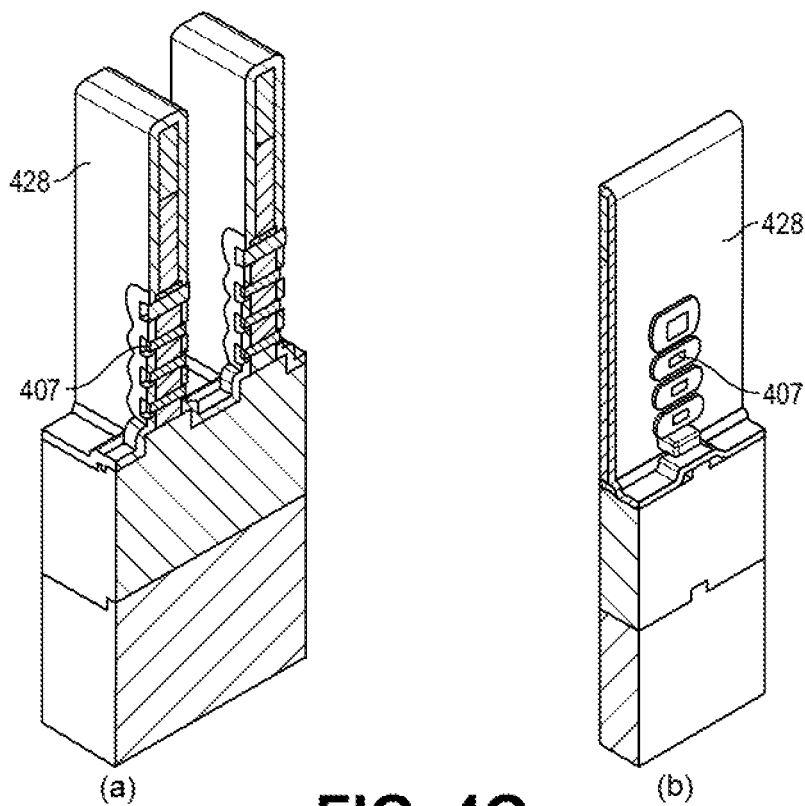

FIG. 4G illustrates the process after another etch is performed to etch the silicon layer 407/silicon nanowires laterally within the dimple spacer 428 to the same level as the sacrificial gate 450. For example, in an embodiment where the dimple spacer 428 is 6 nm in thickness, then the silicon layer 407/silicon nanowires are laterally recessed by 6 nm so that the silicon layer 407/silicon nanowires are flush with the sacrificial gate 450. In one embodiment, the etch may comprise a SiGe dimple spacer etch.

Figure 4H:
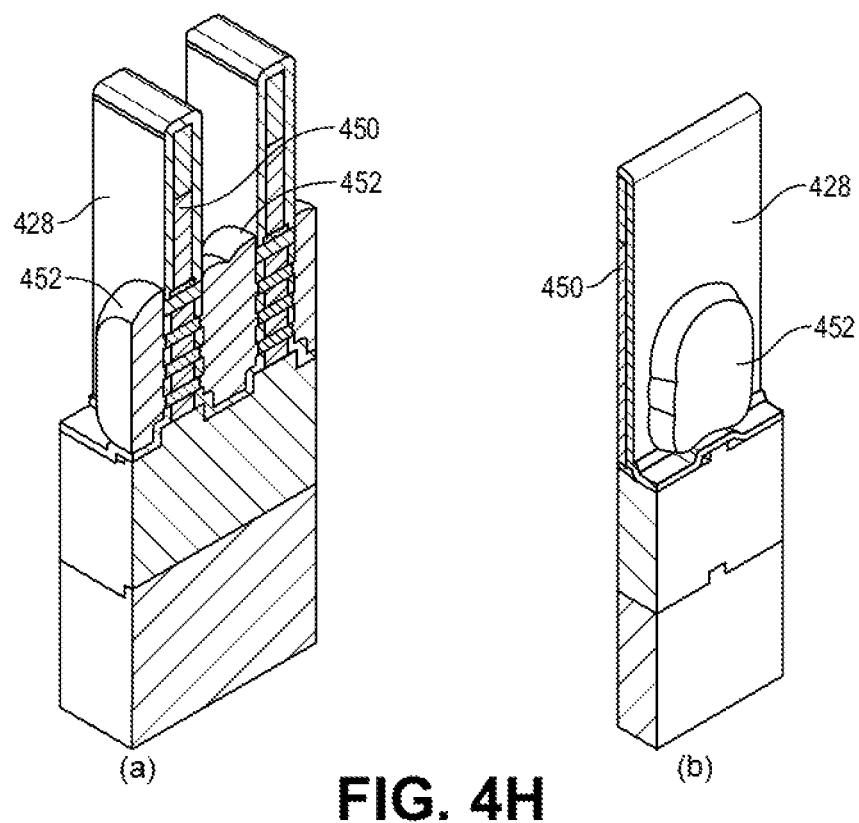

FIG. 4H illustrates the process after a pair of source and drain regions 452 is formed on the exposed silicon layer 407/silicon nanowires on opposite sides of the sacrificial gate 450 (and dimple spacer 428). In an embodiment, forming the pair of source and drain regions 452 includes growing (e.g., by epitaxial growth) to expand a portion of the nanowire. The perimeters of the source and drain regions 452 may be fabricated to be greater than the perimeter of the channel region in this way. In one such embodiment, the nanowire is composed of silicon, and growing the portion of the nanowire includes forming exposed<111> silicon surfaces along the entire perimeter of each of the source and drain regions 452. In a specific such embodiment, forming the exposed<111> silicon surfaces includes using a deposition and subsequent selective faceted etch process. Thus, <111> oriented surfaces may be fabricated by either depositing epitaxial silicon to directly provide<111> facets or by depositing silicon and using an orientation dependent silicon etch. In yet another embodiment, the process may begin with a thicker nanowire followed by subsequent etching using an orientation dependent silicon etch. In an embodiment, forming the pair of source and drain regions includes forming a doping layer on and completely surrounding the perimeter of each of the source and drain regions 452, e.g., a boron doped silicon germanium layer. This layer may facilitate formation of a nanowire with a uniformly doped perimeter.

The fabrication process may then continue with replacement gate processing and contact formation to form a completed IC structure in accordance with the disclosed embodiments.

In embodiments, the nitride hardmask 426, gate spacer 470, dimple spacer 428 and/or the CHM 432 may be formed from suitable spacer or hardmask materials, such as silicon containing materials, nitride containing materials, and the like. In certain embodiments, the spacer materials may be a silicon nitride material, a silicon oxide material (i.e. silicon dioxide), a polysilicon material, or a titanium nitride material. It is contemplated that the materials selected for the fins 204 or mandrel structures and the spacer materials may be suitable for use in the fabrication of FinFET structures. It is also contemplated that the materials selected for the fins 104/204 and the spacer materials 206 may have different characteristics to facilitate selective etching processes.

The spacer materials may be deposited by various techniques, such as chemical vapor deposition (CVD), physical vapor deposition (PVD), or other suitable processes. In one embodiment, the spacer materials may be predominantly conformally deposited over the fins 104/204 and the substrate 202. The spacer materials, after deposition, may exhibit a rounded profile in a shoulder region of the spacer materials. The fins 104/204 may be spaced apart such that when the spacer materials are deposited, a trench 208 may be formed between adjacent fins 104/204.

The integrated circuit structures described herein may be included in an electronic device. As an example of one such apparatus, FIGS. 5A and 5B are top views of a wafer and dies that include one or more integrated circuit structures fabricated with DEPOP using cyclic selective spacer etch, in accordance with one or more of the embodiments disclosed herein.

Figure 5B:
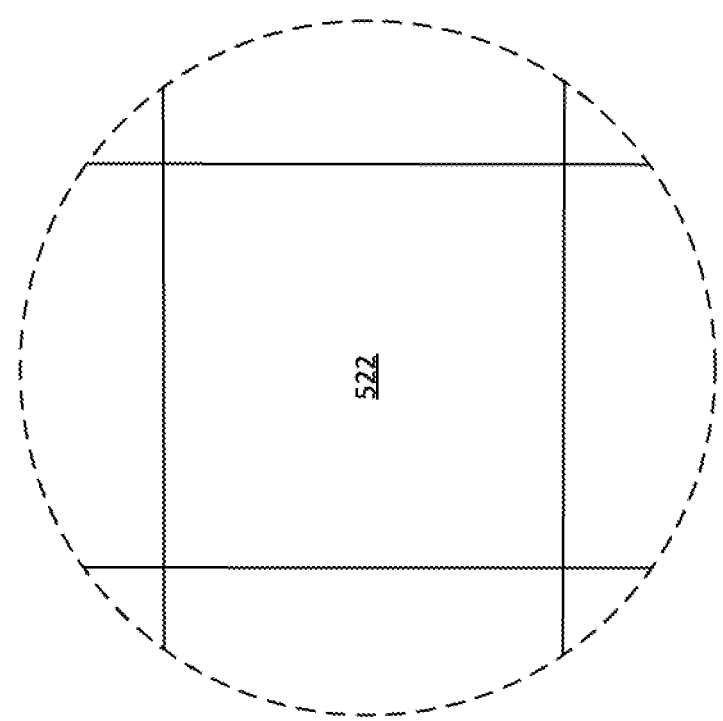
FIGS. 5A and 5B are top views of a wafer and dies that include one or more integrated circuit structures fabricated with DEPOP using cyclic selective spacer etch, in accordance with one or more of the embodiments disclosed herein.
Figure 5A:
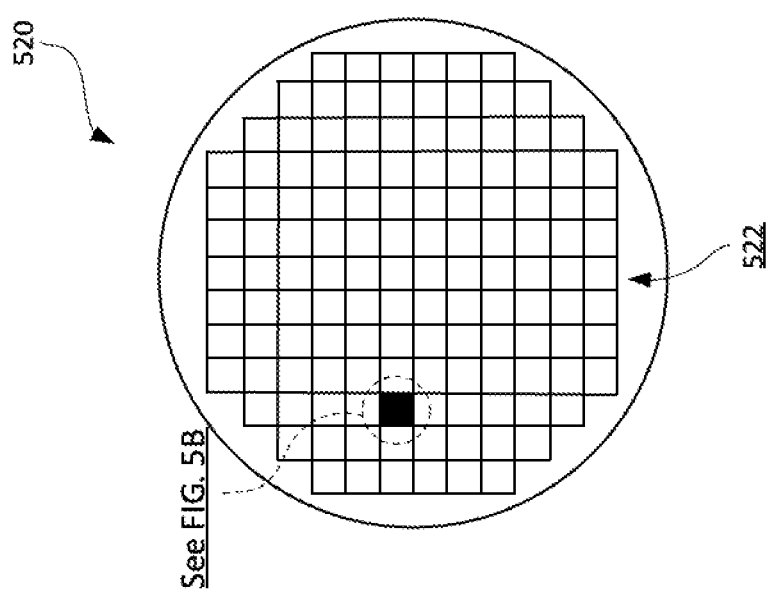

Referring to FIGS. 5A and 5B, a wafer 520 may be composed of semiconductor material and may include one or more dies 522 having integrated circuit (IC) structures formed on a surface of the wafer 520. Each of the dies 522 may be a repeating unit of a semiconductor product that includes any suitable IC (e.g., ICs including one or more integrated circuit structures fabricated with DEPOP using cyclic selective spacer etch, such as described above. After the fabrication of the semiconductor product is complete, the wafer 520 may undergo a singulation process in which each of the dies 522 is separated from one another to provide discrete "chips" of the semiconductor product. In particular, structures that include embedded non-volatile memory structures having an independently scaled selector as disclosed herein may take the form of the wafer 520 (e.g., not singulated) or the form of the die 522 (e.g., singulated). The die 522 may include one or more embedded non-volatile memory structures based independently scaled selectors and/or supporting circuitry to route electrical signals, as well as any other IC components. In some embodiments, the wafer 520 or the die 522 may include an additional memory device (e.g., a static random access memory (SRAM) device), a logic device (e.g., an AND, OR, NAND, or NOR gate), or any other suitable circuit element. Multiple ones of these devices may be combined on a single die 522. For example, a memory array formed by multiple memory devices may be formed on a same die 522 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 6:
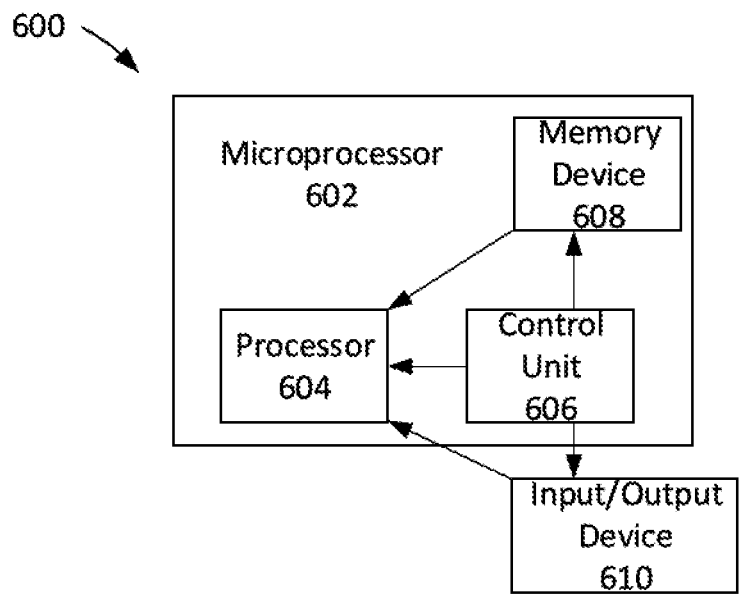
FIG. 6 illustrates a block diagram of an electronic system 600, in accordance with an embodiment of the present disclosure.

FIG. 6 illustrates a block diagram of an electronic system 600, in accordance with an embodiment of the present disclosure. The electronic system 600 can correspond to, for example, a portable system, a computer system, a process control system, or any other system that utilizes a processor and an associated memory. The electronic system 600 may include a microprocessor 602 (having a processor 604 and control unit 606), a memory device 608, and an input/output device 610 (it is to be appreciated that the electronic system 600 may have a plurality of processors, control units, memory device units and/or input/output devices in various embodiments). In one embodiment, the electronic system 600 has a set of instructions that define operations which are to be performed on data by the processor 604, as well as, other transactions between the processor 604, the memory device 608, and the input/output device 610. The control unit 606 coordinates the operations of the processor 604, the memory device 608 and the input/output device 610 by cycling through a set of operations that cause instructions to be retrieved from the memory device 608 and executed. The memory device 608 can include a non-volatile memory cell as described in the present description. In an embodiment, the memory device 608 is embedded in the microprocessor 602, as depicted in FIG. 6. In an embodiment, the processor 604, or another component of electronic system 600, includes one or more integrated circuit structures fabricated with DEPOP using cyclic selective spacer etch, such as those described herein.

Figure 7:
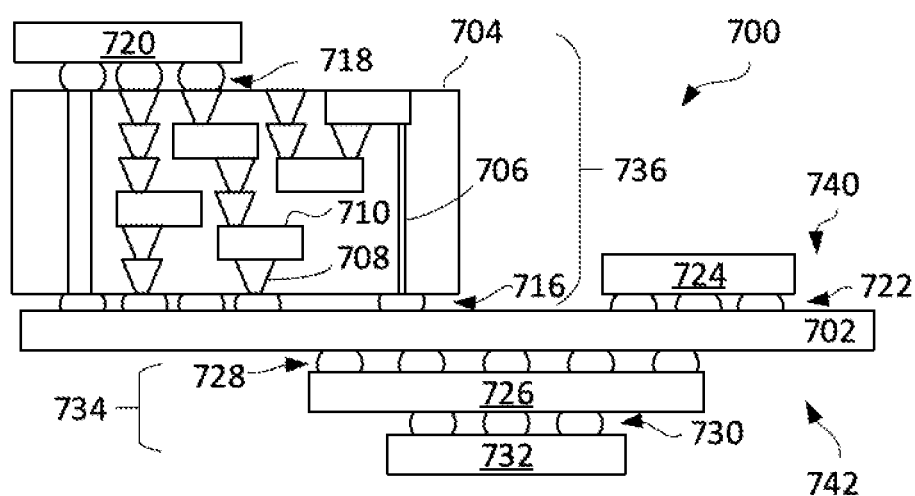
FIG. 7 is a cross-sectional side view of an integrated circuit (IC) device assembly that may include one or more integrated circuit structures fabricated with DEPOP using cyclic selective spacer etch, in accordance with one or more of the embodiments disclosed herein.

FIG. 7 is a cross-sectional side view of an integrated circuit (IC) device assembly that may include one or more integrated circuit structures fabricated with DEPOP using cyclic selective spacer etch, in accordance with one or more of the embodiments disclosed herein.

Referring to FIG. 7, an IC device assembly 700 includes components having one or more integrated circuit structures described herein. The IC device assembly 700 includes a number of components disposed on a circuit board 702 (which may be, e.g., a motherboard). The IC device assembly 700 includes components disposed on a first face 740 of the circuit board 702 and an opposing second face 742 of the circuit board 702. Generally, components may be disposed on one or both faces 740 and 742. In particular, any suitable ones of the components of the IC device assembly 700 may include a number of integrated circuit structures fabricated with DEPOP using cyclic selective spacer etch, such as disclosed herein.

In some embodiments, the circuit board 702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 702. In other embodiments, the circuit board 702 may be a non-PCB substrate.

The IC device assembly 700 illustrated in FIG. 7 includes a package-on-interposer structure 736 coupled to the first face 740 of the circuit board 702 by coupling components 716. The coupling components 716 may electrically and mechanically couple the package-on-interposer structure 736 to the circuit board 702, and may include solder balls (as shown in FIG. 7), male and female portions of a socket, an adhesive, an underfill material, and/or any other suitable electrical and/or mechanical coupling structure.

The package-on-interposer structure 736 may include an IC package 720 coupled to an interposer 704 by coupling components 718. The coupling components 718 may take any suitable form for the application, such as the forms discussed above with reference to the coupling components 716. Although a single IC package 720 is shown in FIG. 7, multiple IC packages may be coupled to the interposer 704. It is to be appreciated that additional interposers may be coupled to the interposer 704. The interposer 704 may provide an intervening substrate used to bridge the circuit board 702 and the IC package 720. The IC package 720 may be or include, for example, a die (the die 522 of FIG. 5B), or any other suitable component. Generally, the interposer 704 may spread a connection to a wider pitch or reroute a connection to a different connection. For example, the interposer 704 may couple the IC package 720 (e.g., a die) to a ball grid array (BGA) of the coupling components 716 for coupling to the circuit board 702. In the embodiment illustrated in FIG. 7, the IC package 720 and the circuit board 702 are attached to opposing sides of the interposer 704. In other embodiments, the IC package 720 and the circuit board 702 may be attached to a same side of the interposer 704. In some embodiments, three or more components may be interconnected by way of the interposer 704.

The interposer 704 may be formed of an epoxy resin, a fiberglass-reinforced epoxy resin, a ceramic material, or a polymer material such as polyimide. In some implementations, the interposer 704 may be formed of alternate rigid or flexible materials that may include the same materials described above for use in a semiconductor substrate, such as silicon, germanium, and other group III-V and group IV materials. The interposer 704 may include metal interconnects 710 and vias 708, including but not limited to through-silicon vias (TSVs) 706. The interposer 704 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 704. The package-on-interposer structure 736 may take the form of any of the package-on-interposer structures known in the art.

The IC device assembly 700 may include an IC package 724 coupled to the first face 740 of the circuit board 702 by coupling components 722. The coupling components 722 may take the form of any of the embodiments discussed above with reference to the coupling components 716, and the IC package 724 may take the form of any of the embodiments discussed above with reference to the IC package 720.

The IC device assembly 700 illustrated in FIG. 7 includes a package-on-package structure 734 coupled to the second face 742 of the circuit board 702 by coupling components 728. The package-on-package structure 734 may include an IC package 726 and an IC package 732 coupled together by coupling components 730 such that the IC package 726 is disposed between the circuit board 702 and the IC package 732. The coupling components 728 and 730 may take the form of any of the embodiments of the coupling components 716 discussed above, and the IC packages 726 and 732 may take the form of any of the embodiments of the IC package 720 discussed above. The package-on-package structure 734 may be configured in accordance with any of the package-on-package structures known in the art.

Figure 8:
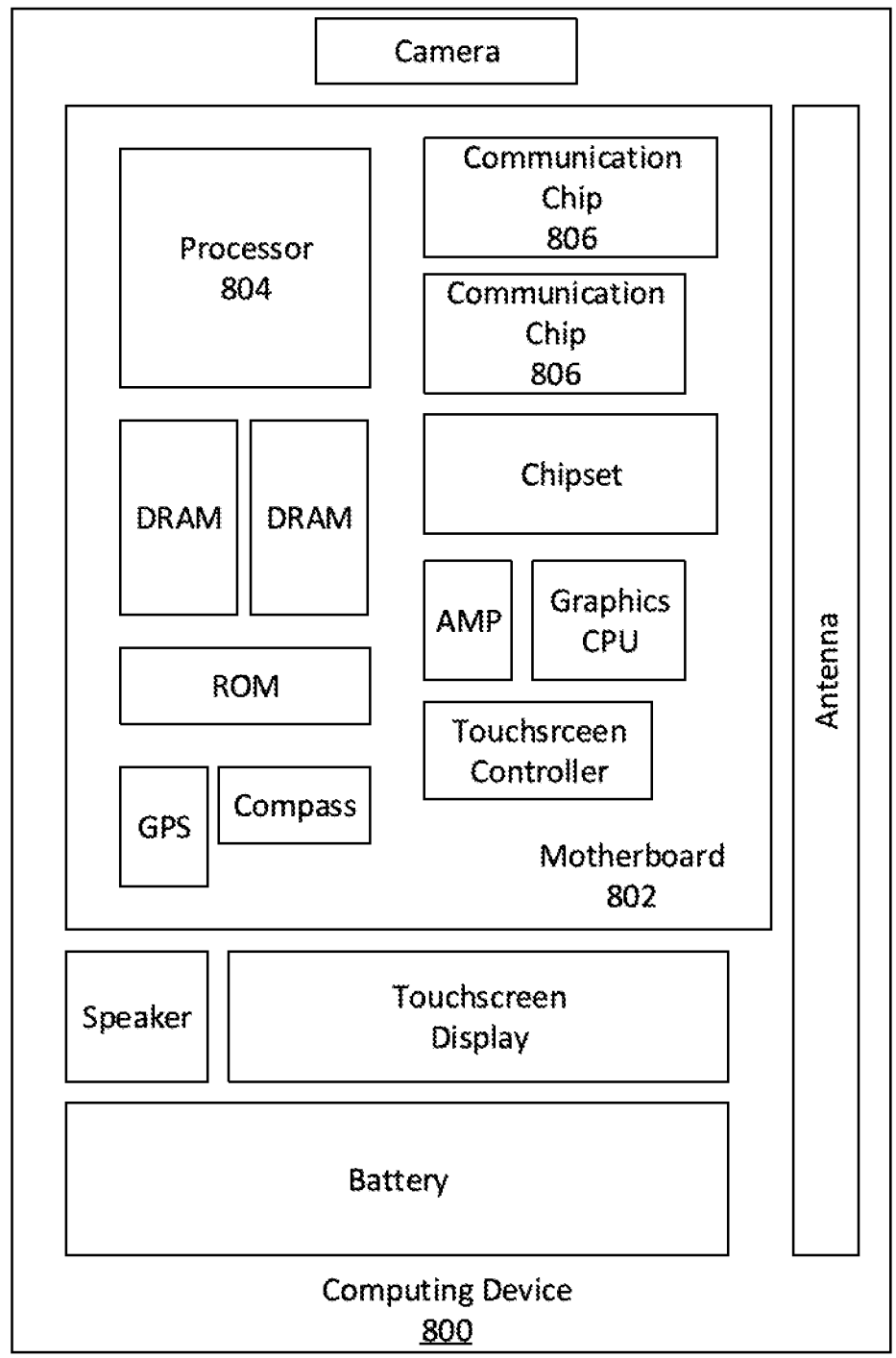
FIG. 8 illustrates a computing device in accordance with one implementation of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes one or more integrated circuit structures fabricated with DEPOP using cyclic selective spacer etch, in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of embodiments of the disclosure, the integrated circuit die of the communication chip includes one or more integrated circuit structures fabricated with DEPOP using cyclic selective spacer etch, in accordance with implementations of embodiments of the disclosure.

In further implementations, another component housed within the computing device 800 may contain an integrated circuit die that includes one or more integrated circuit structures fabricated with DEPOP using cyclic selective spacer etch, in accordance with implementations of embodiments of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Thus, embodiments described herein include integrated circuit structures fabricated with DEPOP using cyclic selective spacer etch.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure comprises a semiconductor fin protruding through a trench isolation region above a substrate. A gate structure is over the semiconductor fin. A plurality of vertically stacked nanowires is through the gate structure, wherein the plurality of vertically stacked nanowires includes a top nanowire adjacent to a top of the gate structure, and a bottom nanowire adjacent to a top of the semiconductor fin. A dielectric material covers only a portion of the plurality of vertically stacked nanowires outside the gate structure, such that one or more one of the plurality of vertically stacked nanowires starting with the top nanowire is exposed from the dielectric material. Source and drain regions are on opposite sides of the gate structure connected to the exposed ones of the plurality of vertically stacked nanowires.

Example embodiment 2: The integrated circuit structure of embodiment 1, wherein the vertically stacked nanowires comprise a material comprising one of: silicon, germanium, and silicon and germanium.

Example embodiment 3: The integrated circuit structure of embodiment 1 or 2, wherein the vertically stacked nanowires are less than approximately 20 nm in width.

Example embodiment 4: The integrated circuit structure of embodiment 1 or 2, wherein the vertically stacked nanowires range from approximately 8-10 nm in width.

Example embodiment 5: The integrated circuit structure of embodiment 1, 2, 3 or 4, wherein the vertically stacked nanowires range from approximately 8-30 nm in length through gate structure.

Example embodiment 6: The integrated circuit structure of embodiment 1, 2, 3, 4, or 5, wherein the vertically stacked nanowires have a wide and flat cross-section shape.

Example embodiment 7: The integrated circuit structure of embodiment 1, 2, 3, 4, 5, or 6, wherein a higher number of exposed vertically stacked nanowires results in additional drive current for the integrated circuit structure.

Example embodiment 8: An integrated circuit structure, comprises a plurality of nonplanar active regions above a substrate, each of the nonplanar active regions comprises a semiconductor fin protruding through a trench isolation region above a substrate. A gate structure is over the semiconductor fin. A plurality of vertically stacked nanowires is through the gate structure, wherein the plurality of vertically stacked nanowires includes a top nanowire adjacent to a top of the gate structure, and a bottom nanowire adjacent to a top of the semiconductor fin. A dielectric material covers only a portion of the plurality of vertically stacked nanowires outside the gate structure, such that one or more one of the plurality of vertically stacked nanowires starting with the top nanowire is exposed from the dielectric material. Source and drain regions are on opposite sides of the gate structure connected to the exposed ones of the plurality of vertically stacked nanowires.

Example embodiment 9: The integrated circuit structure of embodiment 8, wherein at least some the nonplanar active regions have varying numbers of the exposed ones of the plurality of vertically stacked nanowires connected to the respective source and drain regions.

Example embodiment 10: The integrated circuit structure of embodiment 8 or 9, wherein the plurality of nonplanar active regions further comprise: a first nonplanar active region having a first number of the exposed ones of the plurality of vertically stacked nanowires connected to the respective source and drain regions; and a second nonplanar active region having a second number of the exposed ones of the plurality of vertically stacked nanowires connected to the respective source and drain regions.

Example embodiment 11: The integrated circuit structure of embodiment 10, wherein the first nonplanar active region comprises an I/O region and the second nonplanar active region comprises a logic region.

Example embodiment 12: The integrated circuit structure of embodiment 8, 9, 10 or 11, further comprising an isolation structure between and in contact with adjacent ones of the gate structures.

Example embodiment 13: The integrated circuit structure of embodiment 8, 9, 10, 11, or 12, wherein the vertically stacked nanowires comprise a material comprising one of: silicon, germanium, and silicon and germanium.

Example embodiment 14: The integrated circuit structure of embodiment 8, 9, 10, 11, 12, or 13, wherein the vertically stacked nanowires are less than approximately 20 nm in width.

Example embodiment 15: The integrated circuit structure of embodiment 14, wherein the vertically stacked nanowires range from approximately 8-10 nm in width.

Example embodiment 16: The integrated circuit structure of embodiment 8, 9, 10, 11, 12, 13, 14, or 15, wherein the vertically stacked nanowires range from approximately 8-30 nm in length through gate structure.

Example embodiment 17: The integrated circuit structure of embodiment 8, 9, 10, 11, 12, 13, 14, 15 or 16, wherein the vertically stacked nanowires have a wide and flat cross-section shape.

Example embodiment 18: The integrated circuit structure of embodiment 8, 9, 10, 11, 12, 13, 14, 15, 16 or 17, wherein a higher number of exposed vertically stacked nanowires results in additional drive current for the integrated circuit structure.

Example embodiment 19: A method for fabricating a nanowire-based integrated circuit structure comprises forming a semiconductor fin protruding through a trench isolation region above a substrate. A plurality of vertically stacked nanowires and a sacrificial gate structure is formed around the semiconductor fin, wherein the plurality of vertically stacked nanowires are formed through the sacrificial gate structure and includes a top nanowire adjacent to a top of the sacrificial gate structure, and a bottom nanowire adjacent to a top of the semiconductor fin. A spacer comprising a dielectric material is formed over the plurality of vertically stacked nanowires and the sacrificial gate structure. The spacer is removed from one or more of the vertically stacked nanowires on opposite sides of the gate using a cyclic selective spacer etch starting with the top nanowire. Source and drain regions are formed on the opposite sides of the sacrificial gate structure to connect only to the exposed ones of the plurality of vertically stacked nanowires.

Example embodiment 20: The method of embodiment 19, further comprising forming the plurality of vertically stacked nanowires such that respective nanowires range from approximately 8-10 nm in width.

Example embodiment 21: The method of embodiment 19 or 20, wherein removing the spacer from one or more of the vertically stacked nanowires on opposite sides of the gate using the cyclic selective spacer etch further comprises: performing the selective spacer etch a number cycles equal to the number of the vertically stacked nanowires to expose from the spacer.

Example embodiment 22: The method of embodiment 21, further comprising performing the cyclic selective spacer etch such that each cycle comprises a first etch to etch the spacer selective to a first nanowire, and a second etch to etch the first nanowire selective to the spacer to cut the first nanowire.

Example embodiment 23: The method of embodiment 19, 20, 21, or 22, further comprising forming the plurality of vertically stacked nanowires by forming and alternating stack of silicon layers and silicon germanium layers over the semiconductor fin.

Example embodiment 24: The method of embodiment 19, 20, 21, 22, or 23, wherein the semiconductor fin, the plurality of vertically stacked nanowires comprise at least part of a nonplanar active region, the method further comprising: forming a plurality of nonplanar active regions, wherein at least some the nonplanar active regions have varying numbers of the exposed ones of the plurality of vertically stacked nanowires connected to the respective source and drain regions.

Example embodiment 25: The method of embodiment 19, 20, 21, 22, 23, or 24, further comprising replacing the sacrificial gate structure with a metal during a gate replacement process.

What is claimed is:

1. An integrated circuit structure, comprising:
    a semiconductor fin protruding through a trench isolation region above a substrate;
    a gate structure over the semiconductor fin;
    a plurality of vertically stacked nanowires through the gate structure, wherein the plurality of vertically stacked nanowires includes a top nanowire adjacent to a top of the gate structure, and a bottom nanowire adjacent to a top of the semiconductor fin;
    a dielectric material covering only a portion of the plurality of vertically stacked nanowires outside the gate structure, such that one or more one of the plurality of vertically stacked nanowires starting with the top nanowire is exposed from the dielectric material; and
    source and drain regions on opposite sides of the gate structure connected to the exposed ones of the plurality of vertically stacked nanowires.

2. The integrated circuit structure of claim 1, wherein the plurality of vertically stacked nanowires comprise a material comprising one of: silicon, germanium, and silicon and germanium.

3. The integrated circuit structure of claim 1, wherein plurality of vertically stacked nanowires are less than approximately 20 nm in width.

4. The integrated circuit structure of claim 1, wherein the plurality of vertically stacked nanowires range from approximately 8-10 nm in width.

5. The integrated circuit structure of claim 1, wherein the plurality of vertically stacked nanowires range from approximately 8-30 nm in length through the gate structure.

6. The integrated circuit structure of claim 1, wherein the plurality of vertically stacked nanowires have a wide and flat cross-section shape.

7. The integrated circuit structure of claim 1, wherein a higher number of exposed vertically stacked nanowires results in additional drive current for the integrated circuit structure.

8. An integrated circuit structure, comprising:
    a plurality of nonplanar active regions above a substrate, each of the nonplanar active regions comprising:
        a semiconductor fin protruding through a trench isolation region above a substrate;

a gate structure over the semiconductor fin;

a plurality of vertically stacked nanowires through the gate structure, wherein the plurality of vertically stacked nanowires includes a top nanowire adjacent to a top of the gate structure, and a bottom nanowire adjacent to a top of the semiconductor fin;

a dielectric material covering only a portion of the plurality of vertically stacked nanowires outside the gate structure, such that one or more one of the plurality of vertically stacked nanowires starting with the top nanowire is exposed from the dielectric material; and source and drain regions on opposite sides of the gate structure connected to the exposed ones of the plurality of vertically stacked nanowires.

9. The integrated circuit structure of claim 8, wherein at least some the nonplanar active regions have varying numbers of the exposed ones of the plurality of vertically stacked nanowires connected to the respective source and drain regions.

10. The integrated circuit structure of claim 8, wherein the plurality of nonplanar active regions further comprise:

a first nonplanar active region having a first number of the exposed ones of the plurality of vertically stacked nanowires connected to the respective source and drain regions; and a second nonplanar active region having a second number of the exposed ones of the plurality of vertically stacked nanowires connected to the respective source and drain regions.

11. The integrated circuit structure of claim 10, wherein the first nonplanar active region comprises an I/O region and the second nonplanar active region comprises a logic region.

12. The integrated circuit structure of claim 8, further comprising an isolation structure between and in contact with adjacent gate structures.

13. The integrated circuit structure of claim 8, wherein the plurality of vertically stacked nanowires comprise a material comprising one of: silicon, germanium, and silicon and germanium.

14. The integrated circuit structure of claim 8, wherein the plurality of vertically stacked nanowires are less than approximately 20 nm in width.

15. The integrated circuit structure of claim 14, wherein the plurality of vertically stacked nanowires range from approximately 8-10 nm in width.

16. The integrated circuit structure of claim 8, wherein the plurality of vertically stacked nanowires range from approximately 8-30 nm in length through the gate structure.

17. The integrated circuit structure of claim 8, wherein the plurality of vertically stacked nanowires have a wide and flat cross-section shape.

18. The integrated circuit structure of claim 8, wherein a higher number of exposed vertically stacked nanowires results in additional drive current for the integrated circuit structure.

* * * * *